US006940919B2

(12) United States Patent
Myers

(10) Patent No.: US 6,940,919 B2
(45) Date of Patent: Sep. 6, 2005

(54) BANDPASS PREDISTORTION METHOD AND APPARATUS FOR RADIO TRANSMISSION

(75) Inventor: Michael H. Myers, Poway, CA (US)

(73) Assignee: Northrop Grumman Corporation, Los Angeles, CA (US)

(*) Notice: Subject to any disclaimer, the term of this patent is extended or adjusted under 35 U.S.C. 154(b) by 738 days.

(21) Appl. No.: 09/835,594

(22) Filed: Apr. 16, 2001

(65) Prior Publication Data

US 2002/0150171 A1 Oct. 17, 2002

(51) Int. Cl.[7] .............................................. H04L 25/03
(52) U.S. Cl. .................................. 375/296; 455/114.3
(58) Field of Search ................................ 375/297, 296, 375/261; 330/149, 107, 136; 332/124, 159, 107; 455/115, 126, 91, 127, 108

(56) References Cited

U.S. PATENT DOCUMENTS

| | | | | | |
|---|---|---|---|---|---|
| 6,075,411 | A | * | 6/2000 | Briffa et al. ................. | 330/149 |
| 6,141,541 | A | * | 10/2000 | Midya et al. ................. | 455/91 |
| 6,246,865 | B1 | * | 6/2001 | Lee .......................... | 455/114.3 |
| 6,288,610 | B1 | * | 9/2001 | Miyashita ................... | 330/149 |
| 6,307,435 | B1 | * | 10/2001 | Nguyen et al. ............. | 330/149 |
| 6,373,902 | B1 | * | 4/2002 | Park et al. ................... | 375/296 |
| 6,377,116 | B1 | * | 4/2002 | Mattsson et al. .............. | 330/2 |
| 6,489,846 | B2 | * | 12/2002 | Hatsugai ..................... | 330/149 |
| 6,587,513 | B1 | * | 7/2003 | Ichihara ..................... | 375/296 |
| 6,741,663 | B1 | * | 5/2004 | Tapio et al. ................. | 375/297 |
| 2002/0118767 | A1 | * | 8/2002 | Ylamurto .................... | 375/261 |

OTHER PUBLICATIONS

Cartesian feedback amplifier with soft landing; Ohishi, Y.et al; Personal, Indoor and Mobile Radio Communications, 1992. Proceedings, PIMRC '92., Third IEEE International Symposium on Oct. 19–21, 1992 Page(s):402–406.*

Adaptive nonlinear compensation for CDMA communication systems; Gonzalez–Serrano, F.J. et al; Vehicular Technology, IEEE Transactions on vol. 50, Issue 1, Jan. 2001 Page(s):34–42.*

Spectral regrowth of digital signal through an amplifier using a new linearity method; Jing, D.et al; Microwave Conference Proceedings, 1997. APMC '97., 1997 Asia–Pacific Dec. 2–5, 1997 Page(s):525–528 vol. 2.*

Adaptive compensation for imbalance and offset losses in direct conversion transceivers Cavers, J.K.; Liao, M.W.; Vehicular Technology, IEEE Transactions on vol. 42, Issue 4, Nov. 1993 Page(s):581–588.*

* cited by examiner

Primary Examiner—Jay K. Patel
Assistant Examiner—Jacob Meek
(74) Attorney, Agent, or Firm—John A. Miller; Warn, Hoffmann, Miller & LaLone, P.C.

(57) ABSTRACT

An apparatus and method for generating an envelope predistorted radio frequency signal which avoids undesirable spurious emissions. A complex baseband signal, having an in-phase component I and a quadrature component Q, is sampled and filtered in a sampling circuit and filter circuit to obtain samples $I_k$ of the in-phase component and samples $Q_k$, the quadrature component. The magnitude $x_k$ of each sample pair is determined in a first calculation circuit. An amplitude and phase distortion factor $D_k$, based on scaled values of the archyperbolic tangent and the hyperbolic tangent of the baseband sample magnitude is determined in further calculation circuit and a multiplier. Each sample $I_k$ of the in-phase component and $Q_k$ of the quadrature component is multiplied by the corresponding distortion factor $D_k$, and the resulting predistorted components combined and upconverted to provide a predistorted baseband signal which is amplified in a power amplifier having hyperbolic tangent distortion.

29 Claims, 5 Drawing Sheets

BANDPASS PREDISTORTION METHOD AND APPARATUS FOR RADIO TRANSMISSION

CROSS-REFERENCE TO RELATED APPLICATION

This application is related to U.S. patent application Ser. No. 09/624,149 filed Jul. 24, 2000.

FIELD OF THE INVENTION

The present invention pertains to an apparatus for and a method of applying both amplitude predistortion and phase predistortion to a modulated baseband signal. More particularly, the present invention pertains to an apparatus for and a method of generating an amplitude modulated radio frequency signal by amplitude predistorting its baseband signal, using the inverse hyperbolic tangent of a value based on the envelope of the baseband in-phase and quadrature components, and phase predistorting the baseband signal, using the hyperbolic tangent of that value.

BACKGROUND OF THE INVENTION

Environments such as commercial airliners frequently have several radios that operate at different frequencies. Not only must these radios avoid interference with each other, but also they must meet spectrum mask requirements imposed by regulatory agencies, such as the United States Federal Communications Commission. The output from the solid state power amplifier of such a radio often includes distortion that can be characterized by a hyperbolic tangent function. Both amplitude distortion and phase distortion may occur. The transmit spectrum of such a radio signal can spread near the desired signal band if the envelope of the transmitted signal is not constant, particularly if the transmitter power amplifier is being driven into soft saturation. While spurious emissions might be reduced by predistorting of the radio frequency signal envelope just before transmission to the output power amplifier, this requires analog multipliers. Even then, if noise is picked up in the multiplier circuit, that noise will modulate the desired signal and pass through to the output.

One approach to overcoming power amplifier nonlinearity utilizes the function $f(x)=2x/(1+x^2)$ for amplitude predistortion and the function $ph(x)=(\pi f(x))/6=2\pi x/6(1+x^2)$ for phase predistortion, where x is the instantaneous value of the envelope. Another approach to overcoming amplitude distortion is to utilize the "cuber" function $f(x)=x+x^3/3$, where again x is the instantaneous value of the envelope. These approaches have been found to provide less than optimum linearity in the power amplifier output.

SUMMARY OF THE INVENTION

The present invention is an apparatus for and a method of amplitude and phase distorting a modulated radio frequency signal such that after passing of the distorted signal through a non-linear power amplifier, undesirable spurious emissions in the resulting spectrum are reduced. In accordance with the present invention, a complex amplitude modulated baseband signal, having an in-phase component I and a quadrature component Q, is sampled to obtain k samples $I_k$ of the in-phase component and k samples $Q_k$ of the quadrature component, and the magnitude of the envelope of the baseband samples is determined. A distortion factor based on the product of the hyperbolic tangent ("tanh") and the inverse hyperbolic tangent or archyperbolic tangent ("atanh") of a scaled value of the complex baseband sample magnitude is used to multiply each sample of the in-phase component and of the quadrature component so as to provide predistorted components. These predistorted components are combined and used to provide a distorted radio frequency ("RF") signal which is applied to the power amplifier. The power amplifier distortion cancels the distortion in the radio frequency signal so that the power amplifier provides a substantially undistorted output signal.

The scaling factor is obtained by combining a portion of the output signal envelope with the undistorted envelope in a feedback circuit. The feedback circuit preferably computes the mean square error between the undistorted envelope and the output signal envelope. Preferably, to assure that the mean square error is computed correctly, both envelopes are normalized. The mean square error is adjusted by a fixed gain control and integrated, and the result used to scale the undistorted envelope prior to determination of the hyperbolic tangent and archyperbolic tangent functions.

The envelope of the baseband signal is thus subjected to amplitude and phase predistortion prior to upconversion to the radio frequency signal. This avoids impressing pick-up noise on the transmitted envelope. It is possible to do the predistortion prior to intermediate frequency (IF) and RF bandpass filtering of the radio frequency signal since such filtering has a wide bandwidth, allowing the distorted signal spectrum to pass through the power amplifier.

Preferably, the predistortion apparatus of the present invention is implemented in a gate array, such as a field programmable gate array.

BRIEF DESCRIPTION OF THE DRAWINGS

These and other aspects and advantages of the present invention are more apparent from the following detailed description and claims, particularly when considered in conjunction with the accompanying drawings in which like parts bear like reference numerals. In the drawings:

DETAILED DESCRIPTION OF PREFERRED EMBODIMENTS

Figure 1:
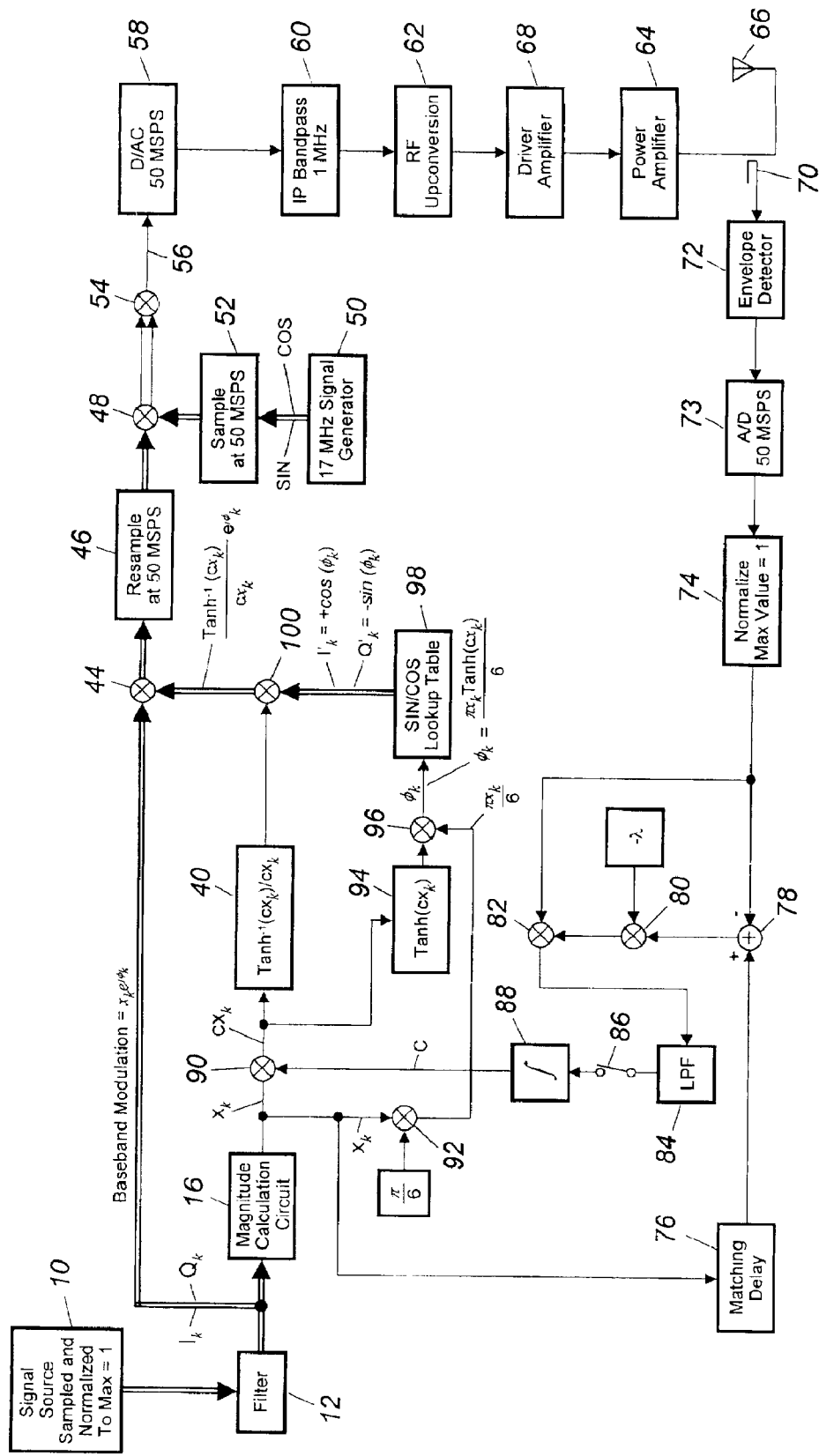
FIG. 1 is a block diagram of an apparatus for generating an amplitude and phase predistorted radio frequency signal in accordance with a preferred embodiment of the present invention.

FIG. 1 depicts an apparatus for generating an amplitude and phase predistorted radio frequency signal in accordance with a preferred embodiment of the present invention. A signal source 10 provides a complex baseband signal $xe^{j\Phi_k}$, where x is the envelope of the signal and, for example, may be an Edge GSM or a D8PSK signal. The signal includes an in-phase component I and a quadrature component Q that are normalized and sampled at, for example, 10.5 kilosamples per second (KSPS). From source 10, the samples are filtered in filter circuit 12 to produce smooth transitions between phase symbols. The samples $I_k$ of the in-phase component and the samples $Q_k$ of the quadrature component are applied from filter circuit 12 to a calculation circuit 16 which calculates the magnitude of the scaled complex baseband envelope sample, for example by determining the square root of the sum of the squares of the scaled in-phase component sample and the scaled quadrature component sample.

Figure 2:
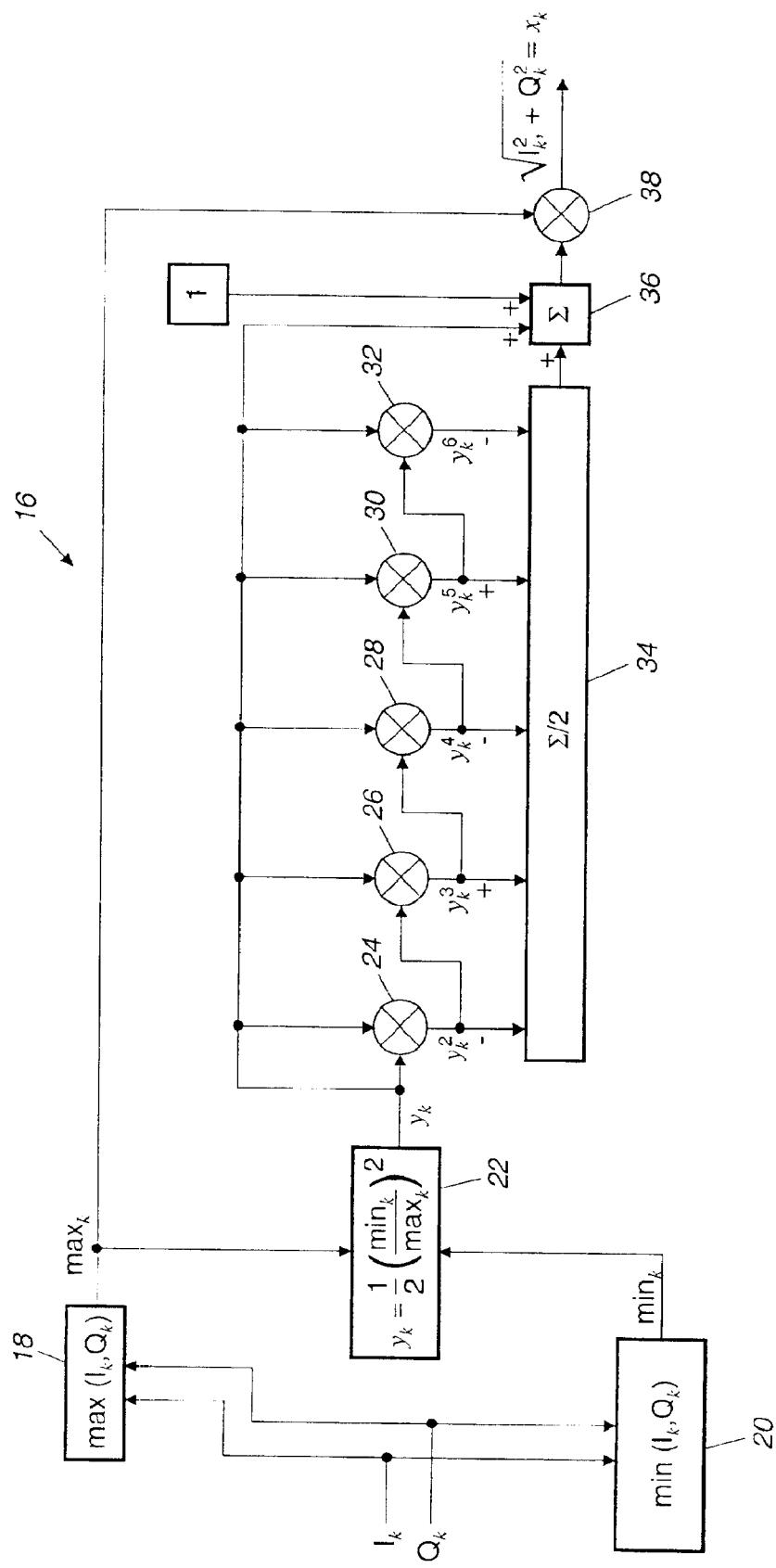
FIG. 2 is a block diagram of one preferred embodiment of a circuit suitable for use in the apparatus of FIG. 1.

FIG. 2 is a block diagram of one preferred embodiment of a calculation circuit for determining an approximation of the magnitude of each complex sample k of the baseband signal. In FIG. 2 the samples $I_k$ of the in-phase component and the samples $Q_k$ of the quadrature component are applied to a first detection circuit 18 which determines the maximum of these samples by determining for each sample pair whether the $I_k$ sample or the $Q_k$ sample is the larger. The $I_k$ and the $Q_k$ samples are also applied to a second detection circuit 20 which determines the minimum of these samples by determining for each sample pair whether the $I_k$ sample or the $Q_k$ sample is the smaller. The detected maximum value ("$max_k$") and the detected minimum value ("$min_k$") for each sample pair are applied to calculating circuit 22 which computes the value $y_k = \frac{1}{2}(min_k/max_k)^2$.

The $y_k$ output from calculating circuit 22 is applied as an input to each of five multiplier circuits 24, 26, 28, 30 and 32. The $y_k$ output is also applied to a second input of multiplier 24. As a consequence, multiplier 24 provides as an output the value $y_k^2$. This $y_k^2$ output from multiplier 24 is applied to the second input of multiplier 26 and to a negative input to summation circuit 34. The output of multiplier 26 is thus the value $y_k^3$. This output is applied to the second input of multiplier 28 and to a positive input of summation circuit 34. Multiplier 28 accordingly provides the output $y_k^4$ which is used as the second input to multiplier 30 and which is applied to a negative input to summation circuit 34. Multiplier 30 then provides the output $y_k^5$ to the second input of multiplier 32 and to a positive input to summation circuit 34. Multiplier 32 provides the output $y^6$ to a negative input to summation circuit 34.

Summation circuit 34 divides the sum of its inputs by 2, thus providing as its output the value $\frac{1}{2}(-y_k^2+y_k^3-y_k^4+y_k^5-y_k^6)$. This signal is applied as an input to summation circuit 36, which also receives as inputs the $y_k$ signal from calculation circuit 22 and the constant 1. The output of summation circuit 36 is thus the value $\{1+y_k+\frac{1}{2}(-y_k^2+y_k^3-y_k^4+y_k^5-y_k^6)\}$. This is equal to the value $\{(1+y_k)/2+\frac{1}{2}(1+y_k-y_k^2+y_k^3-y_k^4+y_k^5-y_k^6)\}$. This signal is applied from summation circuit 36 to one input of multiplier 38, which receives the $max_k$ signal from detection circuit 18 at its second input. Consequently, the output of multiplier 38 is $(max_k) \times \{(1+y_k)/2+\frac{1}{2}(1+y_k-y_k^2+y_k^3-y_k^4+y_k^5-y_k^6)\}$ which is an approximation of $(I_k^2+Q_k^2)^{1/2}$ and thus an approximation of the magnitude $x_k$ of the sample k.

The output from the apparatus of FIG. 1 is provided by power amplifier 64 to antenna 66. Radio frequency coupler 70 couples a portion of that output to envelope detector 72. The detected envelope is applied to analog-to-digital converter 73 which samples at a high sampling rate, shown in FIG. 1 as a sampling rate of 50 megasamples per second (MSPS). The output of analog-to-digital converter 73 is normalized by normalizing circuit 74 so that its maximum valve equals 1. The output of calculation circuit 16 is applied through delay circuit 76 to a positive input of summing circuit 78, while the output from normalizing circuit 74 is applied to a negative input of the summing circuit. The input to summing circuit 78 from calculation circuit 16 represents the envelope before distortion, while the input to summing circuit 78 from normalizing circuit 74 represents the envelope after distortion. Delay circuit 76 assures that each undistorted sample is summed with the normalized output resulting from that same sample. The resulting signal from summing circuit 78 is applied to one input of multiplier 80 which receives a weighting factor of $-\lambda$ at its second input. The output from multiplier 80 is applied to one input of multiplying circuit 82 which receives the output from normalizing circuit 74 at its second input. The output from multiplying circuit 82 is applied through low pass filter 84 to sampler 86 which applies samples of that output at periodic intervals of, for example, one minute to integrator 88. The output of integrator 88 is a scaling factor C and is applied to one input of multiplying circuit 90 which receives the $x_k$ outputs from calculation circuit 16 at its second input. The output of multiplier circuit 90 is thus $Cx_k$.

The $Cx_k$ output from multiplier circuit 90 is applied as an input to calculation circuit 40 which determines the value of $(\text{atanh}(Cx_k))/Cx_k$. By way of an example, calculation circuit 40 might be a lookup table having values to 16 bits for determining a value $x_k^2/3+x_k^4/5+x_k^6/7+\ldots$ which is an approximation of the value $\{(\text{atanh}(x_k))/x_k\}-1$. The output of the lookup table then is applied to one input of a summation circuit which receives the constant 1 at its second input so as to provide an approximation of $(\text{atanh}(x_k))/x_k$. It is preferred that calculation circuit 40, when in the form of a lookup table, compute the value of the segment $\{(\text{atanh}(x_k))/x_k\}-1$, and that the constant 1 be added by a summation circuit in order to provide the desired accuracy while maintaining the lookup table of a moderate size.

The $x_k$ output from calculation circuit 16 is also applied as an input to multiplier 92 which receives the value $\pi/6$ at its second input. The $C x_k$ output from multiplier circuit 90 is applied to calculation circuit 94 which calculates the value $\tanh(Cx_k)$ and applies that value to an input of multiplier 96. Calculation circuit 94 might be a lookup table, for example. The second input of multiplier 96 receives the value $\pi x_k/6$ from multiplier 92. The output of multiplier 96 is thus $(\pi x_k \tanh(Cx_k))/6 = \Phi_k$. This value is applied to lookup table 98 which provides as outputs the values and $Q_k' = -\sin(\Phi_k)$. These values are applied to inputs of multiplier pair 100 which receives the output of lookup table 40 at its second input.

The output of multiplier circuit 100 is thus the distortion factor $\{(\text{atanh}(Cx_k))/Cx_k\}e^{-j\Phi_k} = D_k$. This output is applied to one input of multiplier pair 44. The samples $I_k$ of the in-phase component and the samples $Q_k$ of the quadrature component are also applied to multiplier pair 44. Each sample of the in-phase component and the quadrature component is thus modified by the respective distortion factor $D_k$, so that the output of multiplier pair 44 is $x_k e^{j\Phi_k}\{(\text{atanh}(Cx_k))/Cx_k\}e^{-j\Phi_k} = D_k x_k e^{-j\Phi_k}$. These samples of the modified signal are resampled in resampling circuit 46 at the same sampling rate as in analog-to-digital converter 73, shown in FIG. 1 as a resampling rate at 50 MSPS.

The resampled output from resampling circuit 46 is applied to multiplier pair 48. Signal generator 50 provides an intermediate frequency signal of a frequency less than half the sampling rate of resampling circuit 46, shown in FIG. 1 as a frequency of 17 MHz. Sampling circuit 52 samples the sine and cosine outputs from signal generator 50 at the same sampling rate as resampling circuit 46, shown in FIG. 1 as a sampling rate of 50 MSPS. These sampled sine and cosine signals are applied to multiplier pair 48 so that the multiplier pair provides as outputs the intermediate frequency signals $D_k \times I_k \sin 17$ MHz and $D_k \times I_k \cos 17$ MHz. These signals are added in summation circuit 54, and the resulting predistorted, upconverted intermediate frequency signal is applied on line 56 to digital-to-analog converter 58 which samples at the same 50 MSPS rate as resampling circuit 46.

The output from digital-to-analog converter 58 is applied to band pass filter 60 which is centered at the 17 MHz frequency of signal source 50 and which has a bandwidth sufficient to avoid distortion of the predistorted envelope, for example a bandwidth of 1 MHz. The output from bandpass filter 60 is upconverted to a radio frequency in upconverter 62 and passed through driver amplifier 68 and power amplifier 64 to antenna 66. If desired, a radio frequency attenuator could be utilized, rather than upconverter 62 and driver amplifier 68. Power amplifier 64 has a transfer function C and hyperbolic tangent distortion so that the output of power amplifier 64 is bctanh $(xe^{j\Phi_k}e^{-j\Phi_k}e^{j\Phi_k}\tanh^{-1}(cx))/cx=bcxe^{j\Phi_k}$, where b is the power amplifier gain.

The feedback circuit of FIG. 1 results in the signal C that is applied from integrator 88 to multiplier 90 converging to the current value of the transfer function C of output amplifier 64. It is possible to set the gain of the feedback loop so that it converges in just a few iterations. The value of the feedback gain $-\lambda$ which guarantees stable conversion is upper bounded by the mean square value of the feedback envelope after being normalized by circuit 74.

Predistorting the digital envelope of the baseband signal before upconversion to the radio frequency, followed by digital-to-analog conversion, in accordance with the present invention avoids impressing of analog pickup noise directly on the transmitted envelope, as would occur if the envelope correction were performed on the radio frequency analog signal. Implementation of the present invention does not require significant hardware. It can be accomplished in software or firmware. Implementation on a gate array, such as a field programmable gate array, is convenient.

Figure 3:
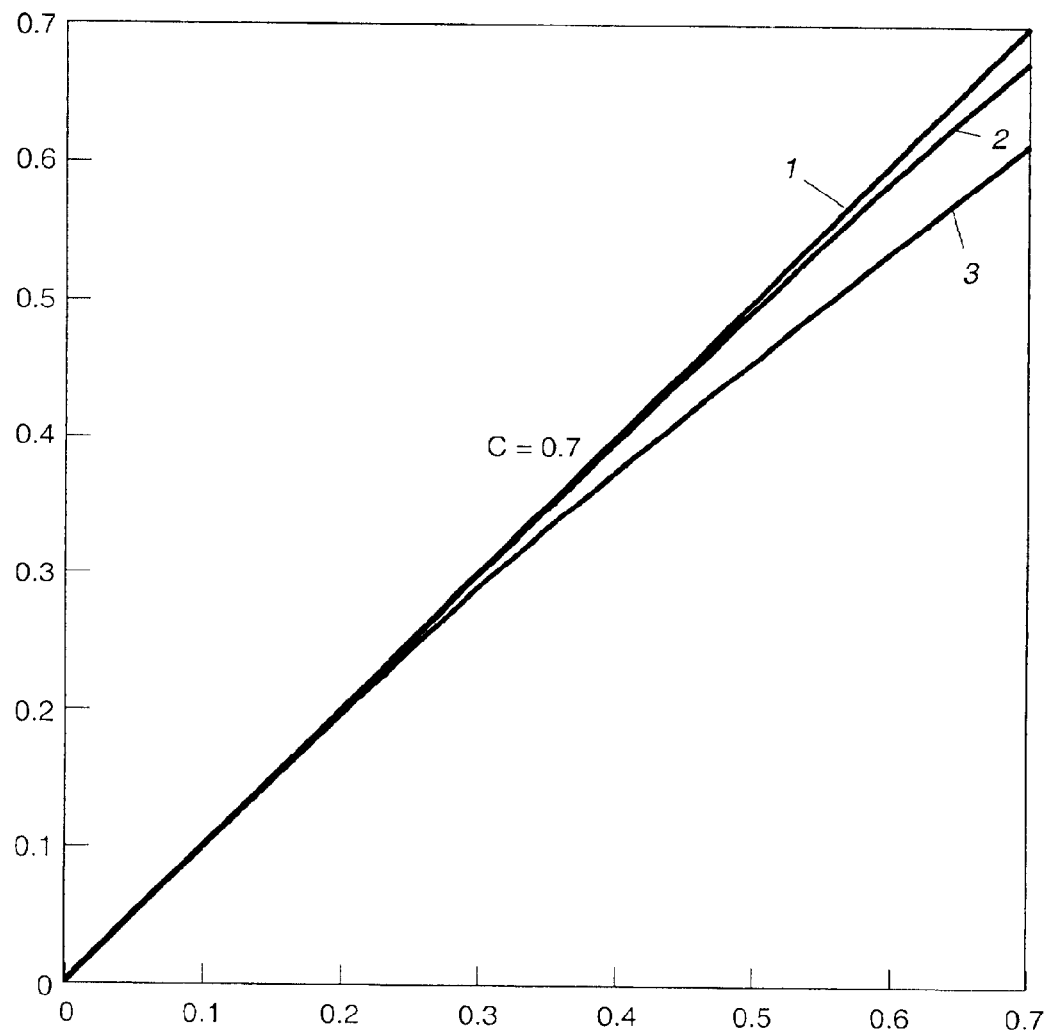
FIG. 3 is a graph of results from a simulation comparing the present invention with the prior art.

FIG. 3 is a plot of power amplifier output as a function of signal input for (1) a computer simulated system in accordance with the present invention with the scaling factor C=0.7, (2) a computer simulated system utilizing the cuber function $f(x)=x+x^3/3$, and (3) a computer simulated system utilizing the functions $f(x)=2x/(1+x^2)$ and $ph(x)=2\pi x/6(1+x^2)$, showing the superiority of the present invention.

Figure 4B:
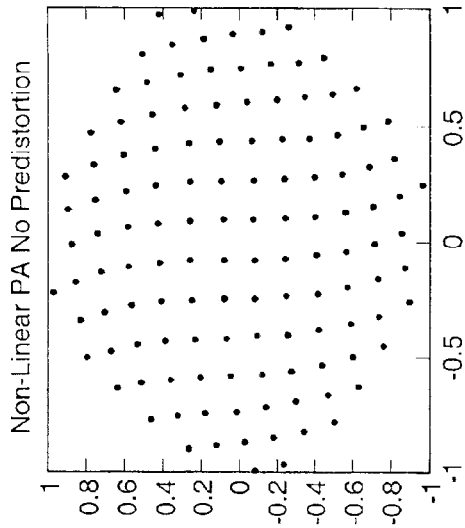
FIGS. 4A–4D plot performance in a simulation of the present invention and the prior art.
Figure 4D:
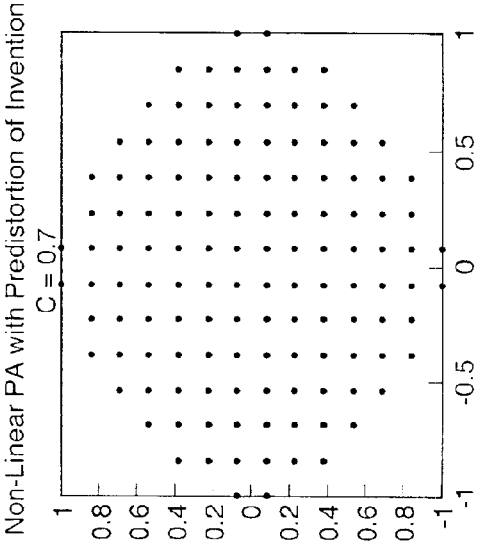
Figure 4A:
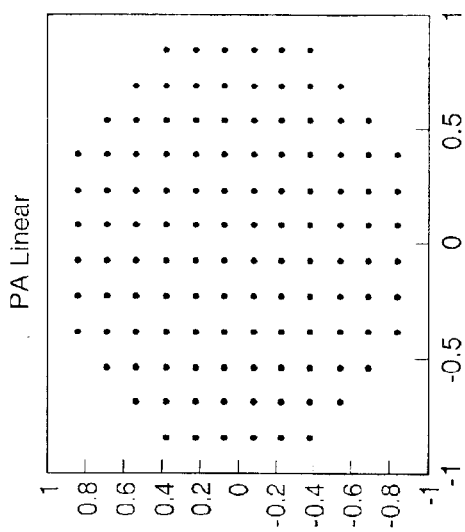
Figure 4C:
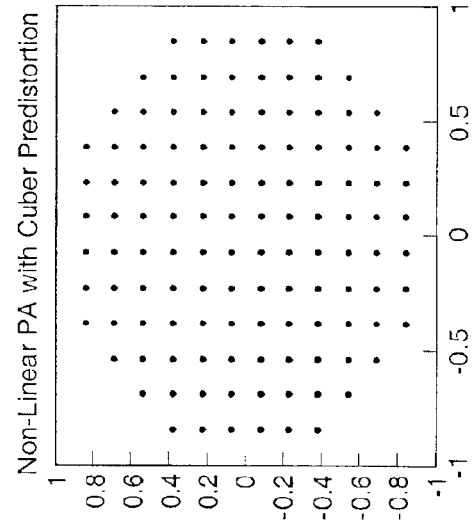

FIGS. 4A–4D are quadrature amplitude modulation plots. FIG. 4A plots the computer simulated output of a linear power amplifier. FIG. 4B plots the computer simulated output of a non-linear power amplifier with no predistortion, but with hyperbolic tangent nonlinearity in phase and amplitude. FIG. 4C plots the computer simulated output of such a nonlinear power amplifier with predistortion based on the cuber function $f(x)=x+x^3/3$. FIG. 4D plots the computer simulated output of such a nonlinear power amplifier with predistortion in accordance with the present invention. As can be seen, the plot for the present invention in FIG. 4D is substantially the same as the plot for a linear power amplifier in FIG. 4A, while the plots of FIGS. 4B and 4C are not, again showing the superiority of the present invention.

Figure 5A:
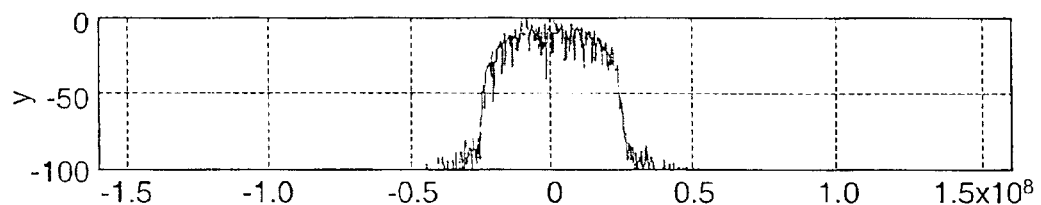
FIGS. 5A–5D show the output spectra from a simulation of power amplifiers in accordance with the present invention and the prior art.
Figure 5B:
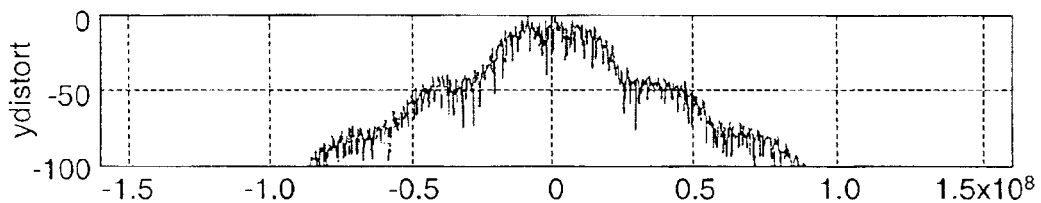
Figure 5C:
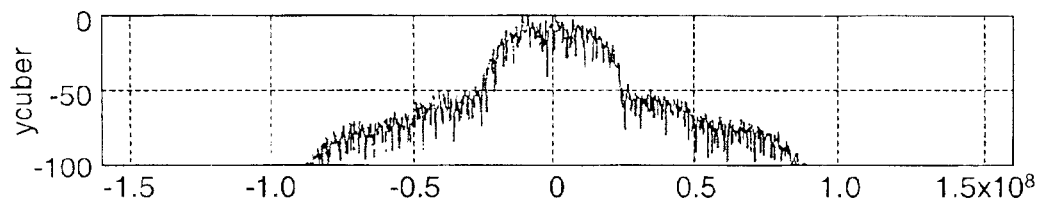
Figure 5D:
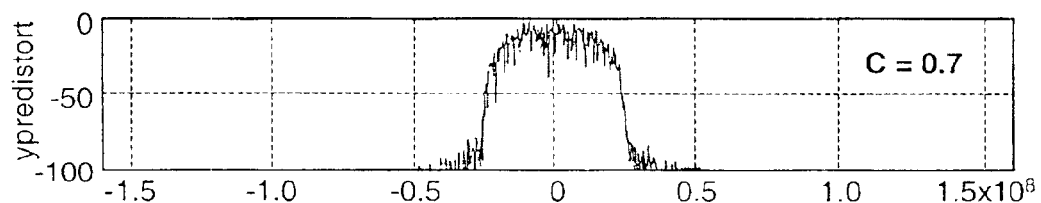

FIG. 5A shows the computer simulated output spectrum of a linear power amplifier. FIG. 5B is the computer simulated output spectrum of a nonlinear power amplifier. FIG. 5C is the computer simulated output spectrum of such a nonlinear power amplifier with predistortion based on the cuber function $f(x)=x+x^3/3$. FIG. 5D is the computer simulated output spectrum of such a nonlinear power amplifier with predistortion in accordance with the present invention with the scaling factor C=0.7. The simulated output spectrum of the present invention most nearly matches that of a linear power amplifier, once more showing the superiority of the present invention.

Although the present invention has been described with reference to preferred embodiments, various alterations, rearrangements, and substitutions could be made, and still the result would be within the scope of the invention.

What is claimed is:

1. A method of predistorting a complex baseband signal x having an in-phase component I and a quadrature component Q, said method comprising the steps of:

sampling the complex baseband signal x to obtain k samples $I_k$ of the in-phase component and k samples $Q_k$ of the quadrature component;

for each of the obtained samples determining a respective distortion factor $D_k=\{(\mathrm{atanh}\ (Cx_k))/Cx_k\}e^{j1\ j\Phi_k}$, where $\Phi_k=(\pi x_k\ \tanh\ (Cx_k))/6$, $x_k$ is the magnitude of the sample k, and C is a scaling factor;

multiplying each of the samples $I_k$ of the in-phase component and each of the samples $Q_k$ of the quadrature component by its respective distortion factor $D_k$ to obtain a predistorted in-phase component sample and a predistorted quadrature component sample; and combining the predistorted in-phase component samples and the predistorted quadrature component samples to provide a predistorted combined signal.

2. A method as claimed in claim 1, wherein for each of the k samples the respective distortion factor $D_k$ is determined by:

determining the magnitude $I_k$ of each of the k samples of the in-phase component and the magnitude $Q_k$ of each of the k samples of the quadrature component;

for each of the k pairs of corresponding samples of the in-phase component and the quadrature component, determining a respective value of $x_k=(I_k^2+Q_k^2)^{1/2}$; and for each value of $x_k$, determining a value of $\tanh\ (Cx_k)$ and a value of $(\mathrm{atanh}\ (Cx_k))/Cx_k$.

3. A method as claimed in claim 2, wherein for each value of $x_k$ the value of $\tanh\ (Cx_k)$ is determined from a lookup table.

4. A method as claimed in claim 2, wherein for each value of $x_k$ the value of $\mathrm{atanh}\ (Cx_k)/Cx_k$ is determined from a lookup table.

5. A method as claimed in claim 2, wherein for each of the k pairs of corresponding samples the respective value of $x_k$ is determined by:

detecting the maximum value of $I_k$ and $Q_k$ by determining the larger of $I_k$ and $Q_k$;

detecting the minimum value of $I_k$ and $Q_k$ by determining the smaller of $I_k$ and $Q_k$;

calculating a value $y_k=\frac{1}{2}\{(\text{the detected minimum value})\div(\text{the detected maximum value})\}^2$; and calculating a value of $(I_k^2+Q_k^2)^{1/2}$ as a function of $y_k$.

6. A method as claimed in claim 5, wherein the value of $(I_k^2+Q_k^2)$ is calculated as (the detected maximum value)×$\{(1+y_k)/2+\frac{1}{2}(1+y_k-y_k^2+y_k^3-y_k^4+y_k^5-y_k^6)\}$.

7. A method of generating an envelope predistorted radio frequency signal, said method comprising the steps of:

providing an envelope modulated signal including a complex baseband signal x having an in-phase component I and a quadrature component Q;

sampling the complex baseband signal x to obtain k samples $I_k$ of the in-phase component and k samples $Q_k$ of the quadrature component;

for each of the obtained samples determining a respective distortion factor $D_k=\{(\mathrm{atanh}\ (Cx_k))/Cx\}e^{-j\Phi_k}$, where $\Phi_k=(\pi x_k\ \tanh\ (Cx_{k)})/6$, $x_k$ is the magnitude of the sample k, and C is a scaling factor;

multiplying each of the samples $I_k$ of the in-phase component and each of the samples $Q_k$ of the quadrature component by its respective distortion factor $D_k$ to obtain a predistorted in-phase component sample and a predistorted quadrature component sample;

combining the predistorted in-phase component samples and the predistorted quadrature component samples to provide a predistorted combined signal;

up-converting the predistorted combined signal to provide a radio frequency signal; and applying the radio frequency signal to a power amplifier have hyperbolic tangent distortion.

8. A method as claimed in claim 7, wherein for each of the k samples the respective distortion factor $D_k$ is determined by:

determining the magnitude $I_k$ of each of the k samples of the in-phase component and the magnitude $Q_k$ of each of the k samples of the quadrature component;

for each of the k pairs of corresponding samples of the in-phase component and the quadrature component, determining a respective value of $x_k=(I_k^2+Q_k^2)^{1/2}$; and for each value of $x_k$, determining a value of tanh $(Cx_k)$ and a value of (atanh $(Cx_k))/Cx_k$.

9. A method as claimed in claim 8, wherein for each value of $x_k$ the value of tanh $(Cx_k)$ is determined from a lookup table.

10. A method as claimed in claim 8, wherein for each value of the $x_k$ the value of atanh $(Cx_k)/x_k$ is determined from a lookup table.

11. A method as claimed in claim 8, wherein for each of the k pairs of corresponding samples the respective value of $x_k$ is determined by:

detecting the maximum value of $I_k$ and $Q_k$ by determining the larger of $I_k$ and $Q_k$;

detecting the minimum value of $I_k$ and $Q_k$ by determining the smaller of $I_k$ and $Q_k$;

calculating a value $y_k=1/2 \{(\text{the detected minimum value}) \div (\text{the detected maximum value})\}^2$;

calculating a value of $(I_k^2+Q_k^2)^{1/2}$ as a function of $y_k$.

12. A method as claimed in claim 11, wherein the value of $(I_k^2+Q_k^2)$ is calculated as (the detected maximum value)×$\{(1+y_k)/2+1/2(1+y_k-y_k^2+y_k^3-y_k^4+y_k^5-y_k^6)\}$.

13. A method as claimed in claim 7, further comprising the step of:

transmitting the radio frequency signal.

14. A method as claimed in claim 7, wherein the scaling factor C is based on a comparison of the envelope of the complex baseband signal x and the envelope of the radio frequency signal.

15. Apparatus for predistorting a complex baseband signal x having an in-phase component I and a quadrature component Q, said apparatus comprising:

a sampling circuit for sampling the complex baseband signal x to provide k samples $I_k$ of the in-phase component and k samples $Q_k$ of the quadrature component;

a distortion determining circuit for determining for each of the provided samples a respective distortion factor $D_k=\{(\text{atanh } (Cx_k))/Cx_k\}e^{31 \ j\Phi_k}$, where $\Phi_k=(\pi x_k \tanh (Cx_k))/6$, $x_k$)/is the magnitude of the sample k, and C is a scaling factor;

a first multiplier for multiplying each of the samples $I_k$ of the in-phase component and each of the samples $Q_k$ of the quadrature component by its respective distortion factor $D_k$ to obtain a predistorted in-phase component sample and a predistorted quadrature component sample; and a summing circuit for combining the predistorted in-phase component samples and the predistorted quadrature component samples to provide a predistorted combined signal.

16. Apparatus as claimed in claim 15, wherein said distortion determining circuit comprises:

a first calculation circuit for determining for each of the k pairs of corresponding samples of the in-phase component and the quadrature component, a respective value of $x_k=(I_k^2+Q_k^2)^{1/2}$; and a second calculation circuit for determining for each value of $x_k$ a value of tanh $(Cx_k)$ and a value of (atanh $(Cx_k))/Cx_k$.

17. Apparatus as claimed in claim 16, wherein said second calculation circuit includes a plurality of lookup tables.

18. Apparatus as claimed in claim 16, wherein said first calculation circuit comprises:

first means for detecting the maximum value of $I_k$ and $Q_k$ by determining the larger of $I_k$ and $Q_k$;

second means for detecting the minimum value of $I_k$ and $Q_k$ by determining the smaller of $I_k$ and $Q_k$;

third means for calculating a value of $y_k=1/2 \{(\text{the detected minimum value}) \div (\text{the detected maximum value})\}^2$; and fourth means for calculating a value if $(I_k^2+Q_k^2)^{1/2}$ as a function of $y_k$.

19. Apparatus as claimed in claim 16, wherein said first calculating circuit calculates the value of $(I_k^2+Q_k^2)^{1/2}$ as (the detected maximum value)×$\{(1+y_k)/2+1/2(1+y_k-y_k^2+y_k^3-y_k^4+y_k^5-y_k^6)\}$.

20. Apparatus as claimed in claim 15, wherein said sampling circuit, said distortion determining circuit, said first and second multipliers, and said summing circuit comprise a gate array.

21. Apparatus as claimed in claim 20, wherein said gate array is a field programmable gate array.

22. Apparatus for generating an envelope predistorted radio frequency signal, said apparatus comprising:

a source of an envelope modulated signal including a complex baseband signal x having an in-phase component I and a quadrature component Q;

a sampling circuit for sampling the baseband signal x to provide k samples $I_k$ of the in-phase component and k samples $Q_k$ of the quadrature component;

a distortion determining circuit for determining for each of the provided samples a respective distortion factor $D_k=\{(\text{atanh } (Cx_k))/Cx_k\}e^{31 \ j\Phi_k}$, where $_k=(\pi x_k \tanh (Cx_k))/6$, $x_k$ is the magnitude of the sample k, and C is a scaling factor;

a first multiplier for multiplying each of the samples $I_k$ of the in-phase component and each of the samples $Q_k$ of the quadrature component by its respective distortion factor $D_k$ to obtain a predistorted in-phase component sample and a predistorted quadrature component sample;

a summing circuit for combining the predistorted in-phase component samples and the predistorted quadrature component samples to provide a predistorted combined signal;

an up-converter for up-converting the predistorted combined signal to provide a radio frequency signal; and a power amplifier having hyperbolic tangent distortion for amplifying the radio frequency signal while canceling the predistortion therein.

23. Apparatus as claimed in claim 22, wherein said distortion determining circuit comprises:

a first calculation circuit for determining for each of the k pairs of corresponding samples of the in-phase component and the quadrature component, a respective value of $x_k=(I_k^2+Q_k^2)^{1/2}$; and a second calculation circuit for determining for each value of $x_k$ a value of (tanh $(Cx_k)$) and a value of atanh $(Cx_k)$)/$Cx_k$.

24. Apparatus as claimed in claim 23, wherein said second calculation circuit includes a plurality of lookup table.

25. Apparatus as claimed in claim 23, wherein said first calculation circuit comprises:

first means for detecting the maximum value of $I_k$ and $Q_k$ by determining the larger of $I_k$ and $Q_k$;

second means for detecting the minimum value of $I_k$ and $Q_k$ by determining the smaller of $I_k$ and $Q_k$;

third means for calculating a value of $y_k$=½ {(the detected minimum value)=(the detected maximum value)}$^2$; and fourth means for calculating a value if $(I_k^2+Q_k^2)^{1/2}$ as a function of $y_k$.

26. Apparatus as claimed in claim 23, wherein said first calculation circuit calculates the value of $(I_k^2+Q_k^2)^{1/2}$ as (the detected maximum value)×{$(1+y_k)/2+½(1+y_k-y_k^2+y_k^3-y_k^4+y_k^5-y_k^6)$}.

27. Apparatus as claimed in claim 22, wherein said sampling circuit, said distortion determining circuit, said first and second multipliers, and said summing circuit comprise a gate array.

28. Apparatus as claimed in claim 27, wherein said gate array is a field programmable gate array.

29. Apparatus as claimed in claim 22, further comprising a circuit for providing the scaling factor C based on a comparison of the envelope of the complex baseband signal x and the envelope of the radio frequency signal.

* * * * *